(12) United States Patent
Busico et al.

(10) Patent No.: US 8,749,772 B2
(45) Date of Patent: *Jun. 10, 2014

(54) INTEGRATED PHOTODIODE WAVELENGTH MONITOR

(75) Inventors: Giacinto Busico, Northampton (GB); Neil David Whitbread, Northampton (GB); Andrew John Ward, Northampton (GB); Andrew Moseley, Northamptonshire (GB)

(73) Assignee: Oclaro Technology Limited, Northamptonshire (GB)

( * ) Notice: Subject to any disclaimer, the term of this patent is extended or adjusted under 35 U.S.C. 154(b) by 233 days.

This patent is subject to a terminal disclaimer.

(21) Appl. No.: 13/383,406

(22) PCT Filed: Jul. 2, 2010

(86) PCT No.: PCT/IB2010/001627
§ 371 (c)(1),
(2), (4) Date: Mar. 9, 2012

(87) PCT Pub. No.: WO2011/007227
PCT Pub. Date: Jan. 20, 2011

(65) Prior Publication Data
US 2012/0162648 A1 Jun. 28, 2012

Related U.S. Application Data

(60) Provisional application No. 61/224,933, filed on Jul. 13, 2009.

(51) Int. Cl.
*G01J 1/42* (2006.01)

(52) U.S. Cl.
USPC ............................................... 356/218

(58) Field of Classification Search
USPC ............ 356/213–235, 416; 257/48, E23.179, 257/E21.528; 438/7
See application file for complete search history.

(56) References Cited

U.S. PATENT DOCUMENTS 4,815,081 A 3/1989 Mahlein et al.
4,828,358 A * 5/1989 Blonder .......................... 385/18
(Continued)

FOREIGN PATENT DOCUMENTS

KR 2001005475 7/2001
WO WO 2010/113015 A1 10/2010

OTHER PUBLICATIONS

Koren, U. et al., "A1.3—MUM Wavelength Laser with an Integrated Output Power Monitor Using a Directional Coupler Optical Power Tap," IEEE Photonics Technology Letters, Mar. 1, 1996, pp. 364-366, vol. 8, No. 3, IEEE Service Center, Piscataway, NJ.

(Continued)

*Primary Examiner* — Hoa Pham
(74) *Attorney, Agent, or Firm* — Fenwick & West LLP

(57) ABSTRACT

An optical wavelength monitor photodiode integrated on a wafer and/or an optical device and coupled to optical components thereof provides wavelength measurement. The optical wavelength monitor includes a photodiode configured to output a signal that is representative of a wavelength of the light. An additional photodiode may be included in the optical wavelength monitor, each photodiode differing from the other in operating characteristics. The monitor may be used in testing the optical device while in wafer form and when the optical device has been cleaved from the wafer at the bar level. Testing/monitoring of the optical device may also be performed during use, for example, to control the wavelength of a laser such as a tunable laser.

13 Claims, 4 Drawing Sheets

(56) References Cited

U.S. PATENT DOCUMENTS

| | | | |
|---|---|---|---|
| 6,714,566 B1 | | 3/2004 | Coldren et al. |
| 7,078,671 B1 | * | 7/2006 | Sherrer .................. 250/216 |
| 7,145,923 B2 | | 12/2006 | Carter et al. |
| 2003/0199109 A1 | * | 10/2003 | Kuzma ..................... 438/16 |
| 2005/0207464 A1 | | 9/2005 | Blauvelt et al. |
| 2006/0013273 A1 | | 1/2006 | Menon et al. |
| 2007/0172169 A1 | | 7/2007 | Kish, Jr. et al. |
| 2009/0140718 A1 | | 6/2009 | Sochava et al. |
| 2012/0104389 A1 | * | 5/2012 | Whitbread et al. ......... 257/48 |

OTHER PUBLICATIONS

Xiucheng, W. et al. "Inline Quantum-Well Waeguide Phogodetectors for the Measurement of Wavelength Shifts," Journal of Lightwave Technology, Dec. 1, 1997, pp. 2278-2283, vol. 15, No. 12, IEEE Service Center New York, NY.

International search report for application No. PCT/IB2010/001627 dated Oct. 18, 2010.

Patent Cooperation Treaty, Written Opinion of the International Searching Authority, International Patent Application No. PCT/IB2010/001627, Oct. 18, 2010, 6 pages.

State Intellectual Property Office of the People's Republic of China, First Office Action, Chinese Patent Application No. 201080040583.0, Feb. 4, 2013, 19 pages.

The State Intellectual Property Office of the People's Republic of China, Second Office Action, Chinese Patent Application No. 201080040583.0, Oct. 10, 2013, 16 Pages (with English translation).

* cited by examiner

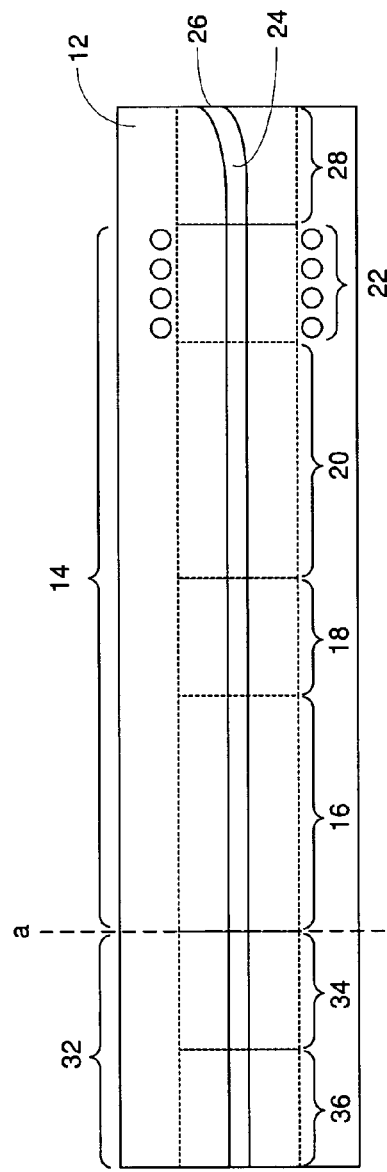
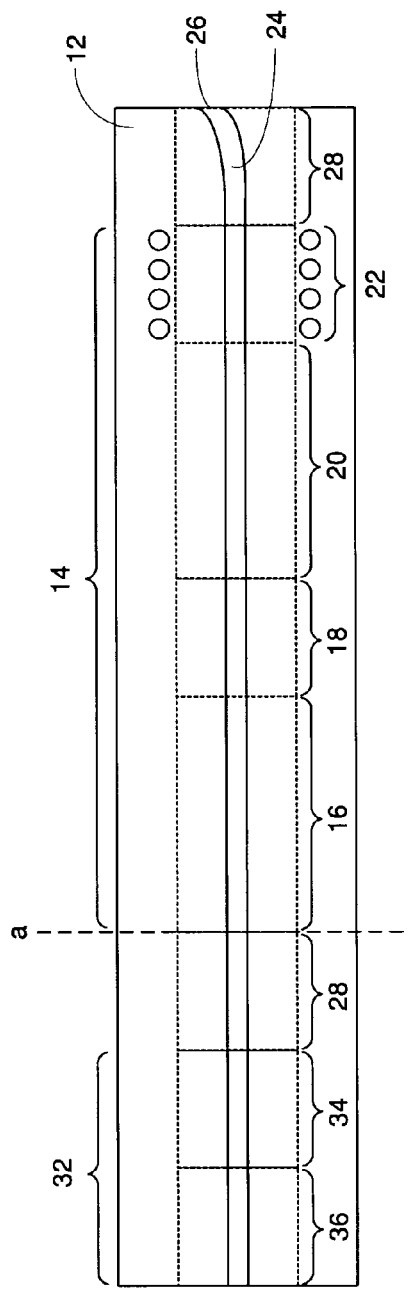

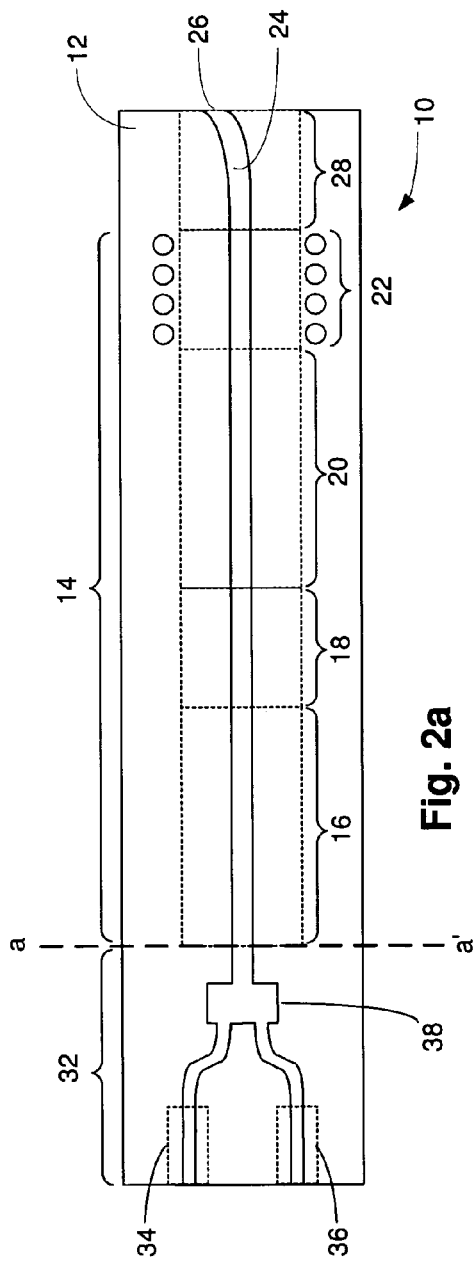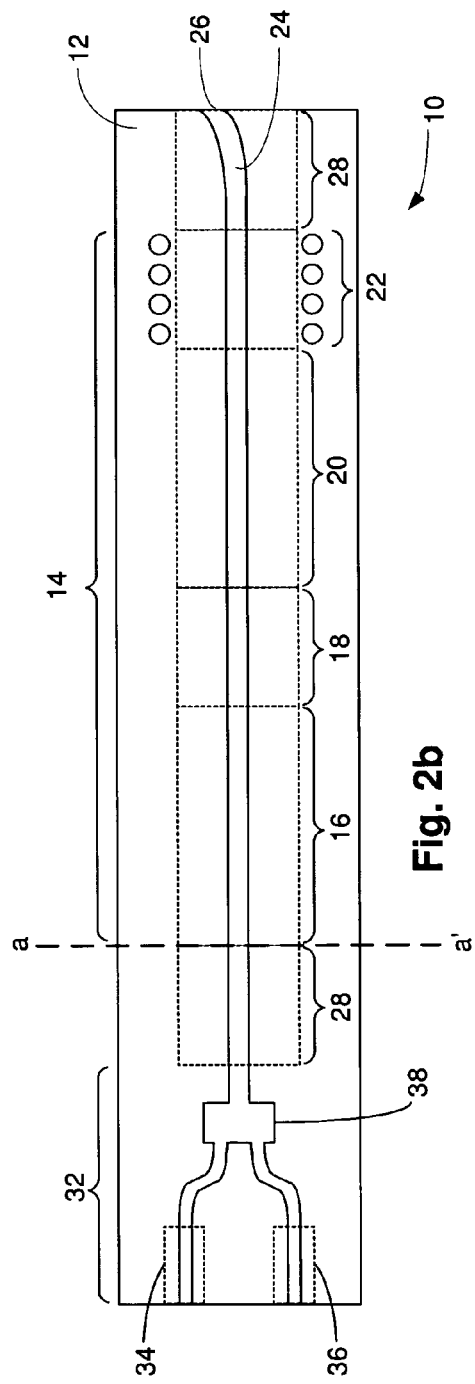
Fig. 2a
Fig. 2b

INTEGRATED PHOTODIODE WAVELENGTH MONITOR

RELATED APPLICATION DATA

This application claims the benefit of U.S. Provisional Patent Application No. 61/224,933 filed Jul. 13, 2009 which is incorporated herein by reference in its entirety.

TECHNICAL FIELD

The present invention relates generally to optical device wavelength monitoring, and in particular to the on-device and on-wafer integration of one or more photodiodes for monitoring the wavelength of a light source produced thereon.

BACKGROUND

The integration of various optical components on optical devices is now established in commercial practice. These integrated components provide functionality to the optical device that is typically intended to be utilized in conjunction with the intended use of the optical device. For example, wavelength tunable lasers may be integrated on an optical device with phase or amplitude modulators such as Mach-Zehnder interferometer modulators. Such lasers are also frequently integrated on the optical device with semiconductor optical amplifiers (SOA). Optical devices including these integrated components are particularly useful in connection with telecommunication applications.

The manufacture of these optical devices is very expensive, due much in part to the significant costs of the testing associated therewith. For example, one parameter that is measured during the testing of an optical device having an integrated wavelength tunable laser is wavelength. In the current state of the art, wavelength measurement is typically performed by optically coupling light emitted from one of the device facets into a suitable wavelength measurement system and therefore cannot be performed on-wafer. It is possible to use a grating out-coupler to extract light (vertically) from the device whilst it is still part of the wafer, but this requires careful optical alignment to collect the emitted light. Wavelength measurement is also sometimes required to be performed during use of the optical device, for example, to maintain a set transmission wavelength of a wavelength tunable laser.

Wavelength output from a laser is conventionally measured by such devices as an off-device wavelength meter instrument, a wavelength division multiplexer (WDM) coupler, or an etalon-type wavelength locker. Typically these methods cannot be performed at wafer level where the device facets have not yet been formed by means of cleaving the wafer into chips upon which the optical devices are formed and coating the exposed ends of the optical waveguides. Grating out-couplers do enable light to be emitted vertically from the device while the device is still part of the wafer, but again an off-device wavelength meter instrument is required for the actual wavelength measurement. Furthermore, instruments such as wavelength meters are slow and expensive. While the use of a WDM coupler is comparatively faster and less expensive, test results are less accurate and the use of bulky equipment is still required, and presently known methods for testing chips while in wafer form are difficult and impractical. Furthermore, an etalon-type wavelength locker is only capable of detecting changes in wavelength over a narrow wavelength range and does not provide test results in the form of absolute wavelength. Etalon-type wavelength lockers are installed at a very late stage on the product line (i.e., during the assembly of the device inside the packages), too late to be used cost effectively to discriminate good devices that provide the required wavelength coverage from those that do not.

SUMMARY OF INVENTION

The present invention provides a convenient, inexpensive, and reliable integrated wavelength monitor for monitoring the wavelength of a light source. The wavelength monitor occupies little real estate and allows for the testing of the light source to be performed prior to the optical device being cleaved from the wafer and without the need for a device facet. The present invention provides an easy and reliable method for wavelength measurement based upon electrical outputs from the chip, outputs that can be accessed while the chip is still in wafer or bar form. The wavelength monitor may be utilized to test the optical device during manufacture and/or during the intended operation of the optical device. Accordingly, the wavelength monitor device may remain on the device subsequent to testing, or the wavelength monitor may be removed (e.g., cleaved) in whole or in part from the device prior to the intended use of the optical device.

The features of the present invention allow for the acquisition of fundamental device parameters at an early stage during device fabrication so as to maximise production yields. For example, the parameters of the optical devices may be acquired while the device is still part of the wafer before being cleaved into chips upon which the optical devices are formed, coated, scribed, assembled onto a carrier and built into a module.

This disclosure describes how to obtain wavelength information from a monolithically integrated device by means of measuring electrical signals generated by the integrated photodiode wavelength monitor, and in this way overcoming the need for forming an optical facet, performing optical alignment and measuring wavelength using an external apparatus.

In accordance with one aspect of the invention, a wafer includes: a plurality of optical devices separable by cleaving, each optical device including a light source including a waveguide, and each light source being configured to output light; and at least one optical wavelength monitor including a photodiode, the optical wavelength monitor being configured to output a signal that is representative of a wavelength of the light output by the light source of at least one optical device included on the wafer.

According to one embodiment, at least a portion of the optical wavelength monitor is arranged on the wafer to remain on the at least one optical device subsequent to cleaving. According to another embodiment, at least a portion of the optical wavelength monitor is arranged on the wafer to remain on at least one of an adjacent optical device or a discardable portion of the wafer subsequent to cleaving.

In accordance with another aspect of the invention, an optical device having an integrated wavelength monitor includes: a light source including a waveguide, the light source being configured to output light; and an optical wavelength monitor including a photodiode, the optical wavelength monitor being configured to output a signal that is representative of a wavelength of the light.

According to one embodiment, the photodiode includes a semiconductor material having a band-gap wavelength that is shorter than the wavelength of the light output through the waveguide. According to another embodiment, the photodiode is configured to absorb a portion of the light output from the light source, the absorption being wavelength dependent.

According to another embodiment, the wavelength monitor includes an additional photodiode configured to output an additional signal that is representative of the wavelength of the light, wherein the outputs of the photodiodes respond differently to wavelength. According to another embodiment, the wavelength monitor includes an additional photodiode configured to output an additional signal that is representative of the total optical power of the light.

According to another embodiment, the photodiode and the additional photodiode are arranged in series along the waveguide. According to another embodiment, the photodiode is arranged within the light source and the additional photodiode is coupled to the light source.

According to another embodiment, the integrated wavelength monitor includes a splitter; and the photodiode and the additional photodiode are arranged in parallel along the waveguide.

According to another embodiment, the optical device is included among a plurality of optical devices in bar form.

In accordance with another aspect of the invention, a method of manufacturing and testing an optical device among a plurality of optical devices on a wafer includes: forming a plurality of optical devices on the wafer, each optical device including a light source including a waveguide, and each light source being configured to output light; forming at least one optical wavelength monitor including a photodiode, the optical wavelength monitor being configured to output a signal that is representative of a wavelength of the light output by the light source of at least one optical device included on the wafer; monitoring the light output from the light source at the optical wavelength monitor; and outputting a signal from the optical wavelength monitor that is representative of the wavelength of the light.

According to one embodiment, monitoring is performed over a range of wavelengths.

According to another embodiment, the method further includes cleaving the optical device from the wafer. According to another embodiment, the monitoring is performed prior to cleaving the optical device from the wafer.

According to another embodiment, the monitoring is performed after cleaving the optical device from the wafer. According to another embodiment, the monitoring is performed when the optical device has been cleaved from the wafer at the bar level.

The foregoing and other features of the invention are hereinafter described in greater detail with reference to the accompanying drawings.

BRIEF DESCRIPTION OF THE DRAWINGS

FIG. 1a is a schematic diagram of an exemplary optical device having an integrated photodiode wavelength monitor in accordance with the invention.

FIG. 1b is a schematic diagram of an exemplary optical device having an integrated photodiode wavelength monitor in accordance with the invention.

FIG. 2a is a schematic diagram of an exemplary optical device having an integrated photodiode wavelength monitor in accordance with the invention.

FIG. 2b is a schematic diagram of an exemplary optical device having an integrated photodiode wavelength monitor in accordance with the invention.

DESCRIPTION

Figure 3:
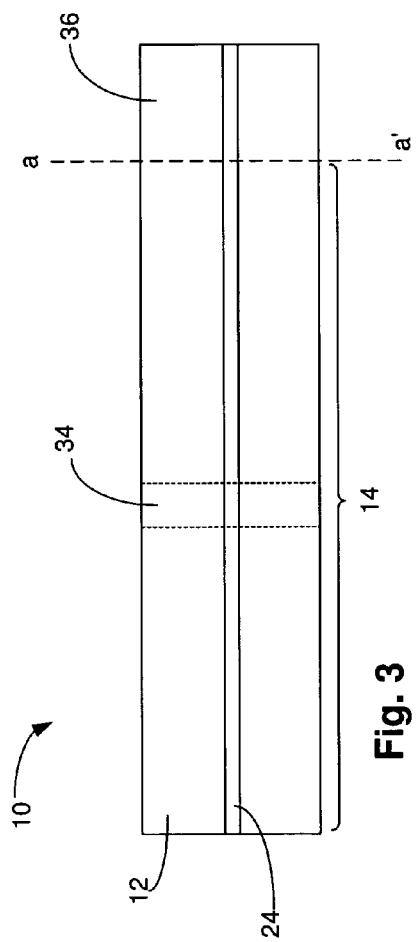
FIG. 3 is a schematic diagram of an exemplary optical device having an integrated photodiode wavelength monitor included within the laser cavity in accordance with the invention.

In the description that follows, like components have been given the same reference numerals, regardless of whether they are shown in different embodiments. To illustrate an embodiment(s) of the present invention in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

Referring now in detail to the drawings and initially to FIGS. 1a and 1b, a schematic diagram of an individual optical device having an integrated photodiode wavelength monitor is shown generally at 10.

The substrate 12 of the optical device 10 (and the wafer from which the optical device may be formed) may be constructed from indium phosphide. Indium phosphide is used herein as an exemplary material because it is a semiconductor material that allows for a range of optical devices such as lasers, photodiodes, couplers, modulators, and the like to be readily constructed and integrated thereon. But the wafer and substrate 12 may also be constructed from any other suitable substrate material, such as, for example, gallium arsenide, silicon, etc.

The optical device 10 includes a light source. In this exemplary embodiment, the light source is a wavelength tunable laser 14, the structure of which is a digital supermode distributed Bragg reflector (DSDBR) laser such as that disclosed in U.S. Pat. No. 7,145,923. While the light source 14 will be illustrated and described chiefly in the context of a DSDBR wavelength tunable laser 14, it is to be understood that the light source may be any suitable light source. The particular design of the light source on the optical device 10 is not germane to the invention in its broadest sense. The DSDBR laser 14 generally includes a rear grating 16, phase control section 18, gain section 20, front grating 22, and waveguide 24. For the sake of brevity, the specific structure and functionality of each of the components of the DSDBR laser 14 will not be described in detail.

In addition to being included in the light source, waveguide 24 may be integrated on the optical device 10 for conveying light that is output from the laser 14. As used herein, a waveguide 24 is a structure for guiding waves, in this case optical waves (signals). Waveguides 24 for respective lasers 14 may be formed on the optical device 10 using any method commonly known in the art. For example, waveguides 24 may be fabricated by the well-known methods of epitaxial growth and semiconductor etching. The waveguide 24 may couple the laser 14 to other components on the optical device, and also allows such light to pass to one or more off-chip devices. The waveguide 24 may be curved as shown in the figures in order that the waveguide 24 meets an output facet 26 of the optical device 10 at an angle such that back reflection is reduced. In other embodiments, the waveguide 24 may be linear.

The optical device 10 may include one or more SOAs 28 coupled to the laser 14 for amplifying the light that is output from the laser 14. As illustrated for example in FIG. 1a, the SOA 28 may be coupled to the front grating 22 of the DSDBR laser 14. An additional SOA 28 may also be coupled to an additional output of the laser 14. As illustrated in FIG. 1b, the additional SOA 28 may be coupled to the rear grating 16 of the DSDBR laser 14. The additional SOA 28 may amplify the light that is output from the laser to a wavelength monitor 32.

The optical device 10 may also include an optical wavelength monitor 32 (wavelength monitor) coupled to the light source for monitoring the wavelength of the light output by the light source. As illustrated in FIG. 1a, the wavelength monitor 32 may be coupled to the rear grating 16 of the laser 14. In such an embodiment, a portion of the light produced by the laser 14 will pass through the rear grating 16 to the wavelength monitor 32. In other embodiments, such as that illustrated in FIG. 1b, the wavelength monitor section 32 may be coupled to the additional SOA 28, which is in turn coupled to laser 14. In such case, a portion of the light produced by the laser 14 will pass through the rear grating 16 to the additional SOA 28, be amplified by the SOA 28, and input to the wavelength monitor 32. Still in other embodiments, there may be passive sections or other functional sections (not illustrated) on the device between the laser and the wavelength monitor.

The wavelength monitor section 32 includes one or more photodiodes 34 and 36. Photodiode 34 may be constructed of any suitable material such that the photodiode 34 is not completely opaque to the light that is output from the laser 14 and transmits a proportion of the light to photodiode 36. Since the absorption is wavelength dependent, the fraction of light transmitted will also be a function of wavelength. But photodiode 34 transmits at least some light at all wavelengths over which the wavelength monitor is to operate. In one embodiment, photodiode 34 may transmit most of the incident light (greater than 90% over all required wavelengths). In another embodiment, photodiode 34 may transmit the majority of the incident light (greater than 50% over all required wavelengths). In yet another embodiment, photodiode 34 may transmit only a small minority of the incident light (greater than 1% over all required wavelengths). This transparency may be achieved by the use of a suitable choice of one or more semiconductor alloys having a shorter band-gap wavelength for the active layer(s) of the photodiode 34 than the range of wavelengths over which the light source (e.g., tunable laser) is configured to operate. The photodiode 34 may be made of a photoactive semiconductor material having a band-gap wavelength that is about 100-200 nm shorter than the range of wavelengths output by the light source, but the semiconductor material from which the photodiode 34 is made may have a band-gap wavelength ranging from, for example, about 50 nm to 250 nm shorter than the range of wavelengths output by the light source. In an exemplary embodiment, photodiode 34 may be constructed of the same material as the laser tuning material of the DSDBR laser 14. This provides for ease of manufacture where, for example, the photodiode 34 is to be integrated on the same or an adjacent optical device on a semiconductor wafer. Photodiode 34 responds to the incident light, and is typically operated in a reverse bias mode. The photodiode 34 responds to the light such that the current developed by the photodiode 34 varies with the wavelength of that light. Typically, the current will increase monotonically with decreasing wavelength of light. Hence, photodiode 34 is wavelength dependent (or wavelength sensitive). Additionally, the bias applied to photodiode 34 may be varied to adjust the wavelength response in order to, for example, adjust the sensitivity of the photodiode 34 if the wavelength of the incident light is known to be within a given range. For example, the bias applied if the wavelength is known to lie between 1525 nm and 1550 nm might be different to the bias applied if the wavelength is known to lie between 1550 nm and 1575 nm. Clearly other, more complex, wavelength range criteria could be used.

An additional photodiode 36 in optical series with the photodiode 34 may optionally be included in the wavelength monitor 32 and may be used at least in part to enhance the accuracy of the wavelength monitor 32. In one embodiment, additional photodiode 36 may be constructed such that the wavelength dependence of absorption of the incident light is different from that of photodiode 34. The additional signal output by the photodiode 36 of the optical wavelength monitor 32 is representative of the wavelength of the light. In this embodiment, the suitable transparency and band-gap wavelength of photodiode 36 may be similar to the ranges described above with respect to photodiode 34, so long as the wavelength dependence of one photodiode is different from that of the other. As an example, optional photodiode 36 may be constructed of the same material as the gain section 20 material of the DSDBR laser 14. The gain section 20 material of the laser 14 possesses different band edge energy from the laser tuning material of the DSDBR laser 14 that may be utilized in photodiode 34, and therefore optional photodiode 36 responds differently to wavelength as compared with photodiode 34. In other words, the representative curves of electrical output response to wavelength of light absorption is different for the two photodiodes 34 and 36.

In another embodiment, additional photodiode 36 is configured such that it absorbs most or all the incident light output to the wavelength monitor 32 from the laser 14 at all wavelengths over which the wavelength monitor is to operate. Accordingly, optional photodiode 36 may be constructed of any suitable material that is relatively opaque to the light output from the laser 14. In one embodiment, photodiode 36 may be more than about 99% opaque to the light over all operational wavelengths. In another embodiment, photodiode 36 may be more than about 95% opaque to the light over all operational wavelengths. In yet another embodiment, photodiode 36 may be more than about 90% opaque to the light over all operational wavelengths. The additional photodiode 36 may have a flat response to wavelength such that absorption of the light by the additional photodiode 36 is wavelength independent. The additional signal output by the photodiode 36 in this embodiment may be representative of the total optical power of the light. The signal from additional photodiode 36 may be used to normalize the signal from photodiode 34 by the total measured optical power. Thus the wavelength measurement may be made independent of the output power of the laser 14.

When photodiodes 34 and 36 are operated under reverse bias, photodiode 34 produces a photocurrent signal ($I_1$) which increases with decreasing wavelength at constant optical power. In one embodiment, additional photodiode 36 produces a photocurrent signal ($I_2$) which also increases with decreasing wavelength at constant optical power. In another embodiment, additional photodiode 36 absorbs most or all incident light to produce signal ($I_2$). The photocurrent signals ($I_1$) and ($I_2$) may be measured as the voltage across the output electrodes of the photodiodes or the current produced by the photodiodes. Said signals may be measured simultaneously (e.g., laser mapping is performed by monitoring a range of wavelengths using both photodiodes 34 and 36) or in sequence (e.g., laser mapping performed first by monitoring a range of wavelengths using photodiode 34 followed by a laser mapping performed by monitoring the range of wavelengths using photodiode 36). When two signals are output from the wavelength monitor section 32, the wavelength may be derived by the ratio (or another mathematical function) between the two signals. Derivation of the wavelength by use of the ratio (or another mathematical function) provides for normalization of power variation due to the laser. The specific equation used to derive the wavelength may vary depending on such factors as the properties of the photodiodes (e.g., band gap) and the topology of the wavelength monitor section 32. For example, in the embodiments of FIGS. 1a and 1b, the equation $I_1/(I_1+I_2)$ yields a power-independent measure of wavelength. Although other suitable exemplary equations such as $(I_1-I_2)/(I_1-I_2)$ may be used to measure wavelength. Multiple mathematical expressions may be suitable for such purpose, and the mathematical expression that best describes the relation between wavelength and the generated photocurrent signals may be used.

The output from the photodiode wavelength monitor (i.e., the one or more signals output from the photodiodes) may be recorded during monitoring and analyzed to assess the performance of the laser over the range of wavelengths in which the device 10 is to operate. The output from the photodiode wavelength monitor may be used in an electronic circuit to control the wavelength of the laser 14. For example, the signals and/or measure of wavelength may be output to a control circuit (not illustrated) for controlling the laser 14.

FIGS. 1a and 1b illustrate photodiodes 34 and 36 as being arranged in series. However it is to be understood that the photodiodes 34 and 36 are not to be limited to such an arrangement, and any suitable arrangement may be provided. For example, FIGS. 2a and 2b illustrate embodiments wherein photodiode 34 and additional photodiode 36 are arranged in parallel. In the embodiments of FIGS. 2a and 2b, the wavelength monitor section includes a splitter 38 that divides the light in a desired ratio between photodiode 34 and additional photodiode 36. The ratio that the optical splitter 38 divides the light may be even (e.g., 50/50) or offset. Furthermore, the optical splitter 38 may be wavelength independent, but the use of a wavelength dependent splitter is contemplated in order to enable, for example, a greater degree of wavelength discrimination and measurement sensitivity. Furthermore, it is not necessary for photodiode 34 to be relatively transparent in this parallel arrangement, the wavelength response of photodiode 34 should remain sufficiently different from that of additional photodiode 36.

In the embodiments of FIGS. 2a and 2b, the treatment of the signals from the photodiodes would be the same as from the series arrangement of photodiodes exemplified in FIGS. 1a and 1b. When two signals are output from the wavelength monitor section 32, the wavelength may be derived by the ratio (or another mathematical function) between the two signals. Again, the specific equation used to derive the wavelength may vary depending on such factors as the properties of the photodiodes (e.g., band gap) and the topology of the wavelength monitor section 32. For example, the equation $I_1/I_2$ yields a power independent measure of wavelength where the splitter has a 50:50 split ratio. Where the optical split ratio is other than 50:50, a simple compensating factor may be introduced.

In other embodiments, photodiodes 34 and 36 may be arranged in any suitable arrangement in order to achieve more precise wavelength monitoring. For example, while the photodiodes 34 and 36 are illustrated as being arranged on the same waveguide as the source of light, light may instead be coupled from the waveguide 24 to the photodiodes by means of one or more directional couplers, as are well-known in the art. Light may be coupled into a waveguide monitor placed on one waveguide from a parallel waveguide. In some embodiments, MMI-splitters, y-couplers or vertical couplers may be used to couple light from the waveguide connected to the light source to one or more waveguides connected to the photodiode(s). Other embodiments that include photodiodes arranged in combinations of series and parallel in order to achieve more precise wavelength monitoring are also contemplated.

The wavelength monitor 32 may be located at any appropriate location on the optical device 10 relative to the laser. For example, the wavelength monitor 32 may be located such that it is coupled to the laser proximal the front grating 22. Furthermore, as illustrated in FIG. 3, a portion of the wavelength monitor 32 may be located within the laser 14. Here the wavelength dependent photodiode is 34 and the wavelength independent photodiode is 36. An arrangement where a portion of wavelength monitor 32 is located within the laser 14 may be suitable when part of the laser structure is also suitable to be used as one of the photodiodes 34 and 36.

The wavelength monitor 32 of the present invention may be used to test the optical device prior to and/or during use of the optical device 10. As such, the wavelength monitor 32 may monitor the light source of the optical device which the optical device is in wafer form, bar form, and/or individual form. In one embodiment, the wavelength monitor 32 may monitor the performance of the light source at either a particular wavelength or over a range of wavelengths. For example, the one or more signals respectively output from the wavelength monitor section 32 may be utilized in mapping wavelength versus tuning currents over the range of wavelengths in which the device 10 is to operate. In another embodiment, the wavelength monitor 32 may monitor wavelength drift during operation of the device.

When used only in testing prior to use of the optical device 10, the wavelength monitor 32 may be severed from the optical device 10 subsequent to the testing procedure. As illustrated in the exemplary embodiments of FIGS. 1a, 1b, 2a, and 2b, the optical device 10 may be cleaved along line a-a', thereby severing the wavelength monitoring section from the remainder of the optical device. In other embodiments, it may be desired that only a portion of the wavelength monitor be cleaved from the optical device 10. As illustrated in FIG. 3, the wavelength independent photodiode 36 may be cleaved along a-a' before the optical device 10 is used in its intended application.

Figure 4:
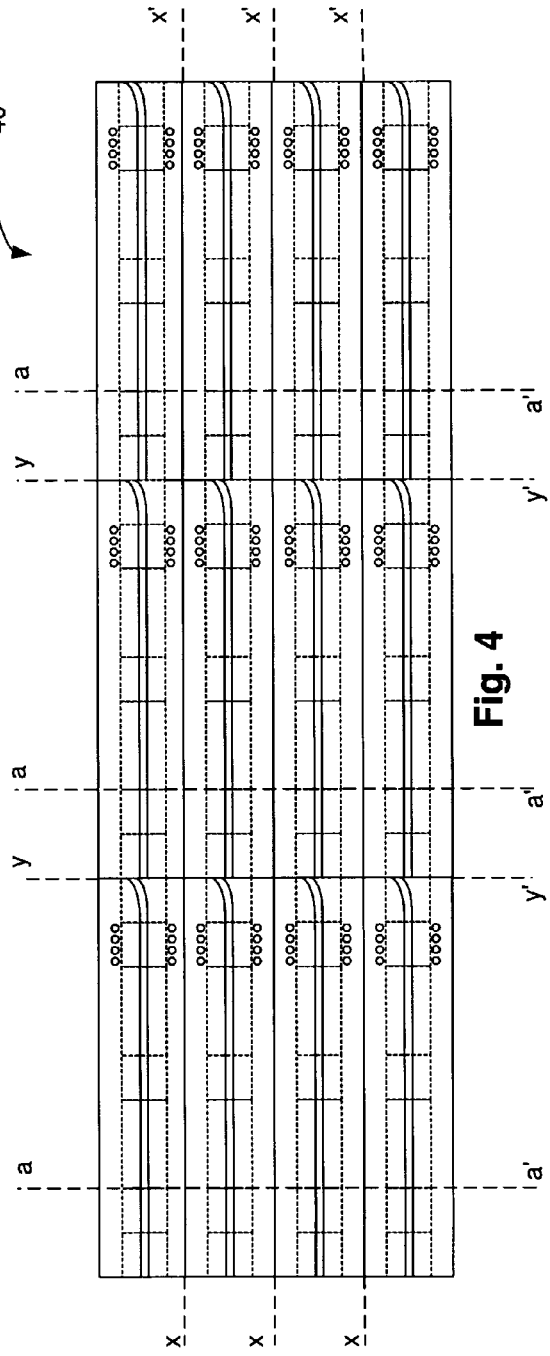
FIG. 4 is a schematic diagram of an exemplary wafer including a plurality of optical devices, each optical device having an integrated photodiode wavelength monitor in accordance with the invention.

With reference to FIG. 4, individual optical devices 10 may be formed on and cleaved from a wafer 40 that includes a plurality of individual optical devices. As illustrated, a wavelength monitor may be associated with each individual device, which allows for the structures of the individual optical devices (e.g., the laser) to be tested prior to being cleaved from the wafer 40. Of course, a single wavelength monitor on the wafer may be coupled to a plurality of optical devices for testing the coupled optical devices, either separately or simultaneously. Furthermore, while the wafer 40 is illustrated as including a plurality of individual optical devices similar to that which is illustrated in FIG. 1a, the individual optical chips of the wafer 40 may be any suitable design, such as those illustrated in the Figures.

Figure 5:
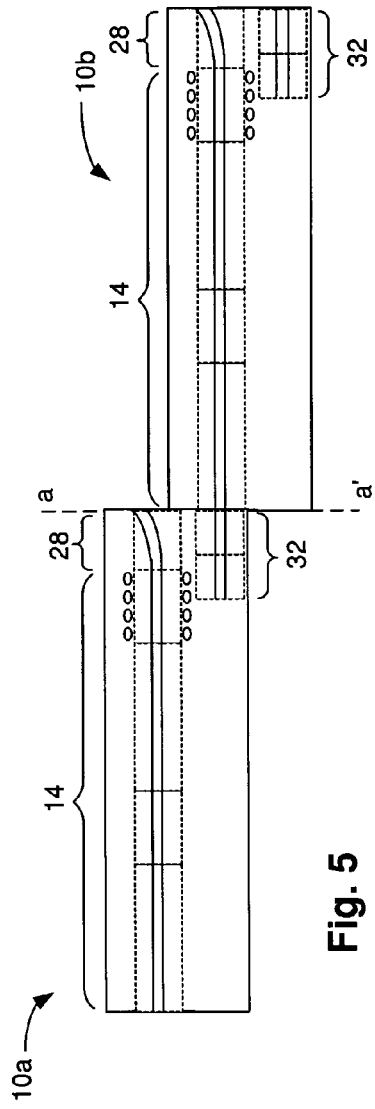
FIG. 5 is a schematic diagram of two optical devices belonging to two adjacent columns on the wafer and having sacrificial integrated photodiode wavelength monitors included thereon in accordance with the invention.
Figure 6:
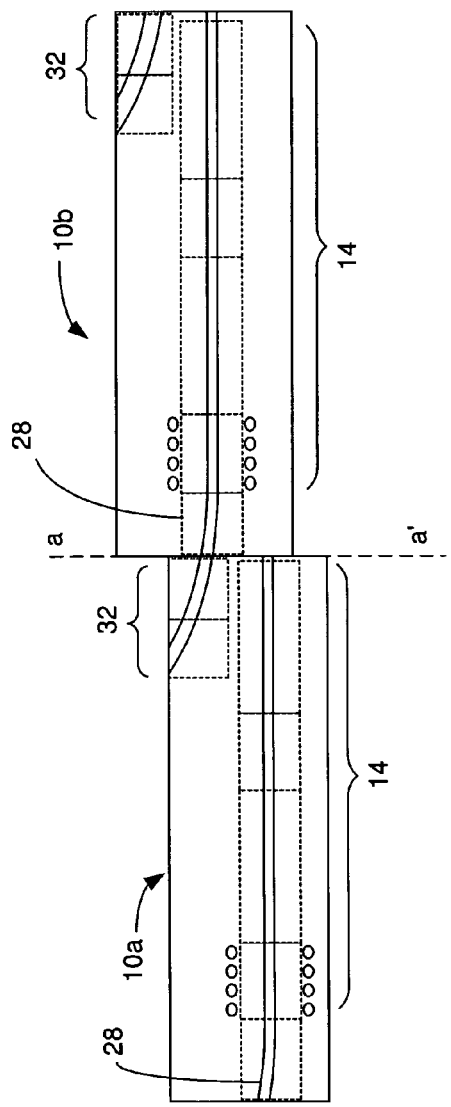
FIG. 6 is a schematic diagram of two optical devices belonging to two adjacent columns on the wafer and having sacrificial integrated photodiode wavelength monitors included thereon in accordance with the invention.

A wafer 40 may include a plurality of optical devices arranged in columns (bars) and rows, wherein columns (bars) and rows of optical devices are formed upon chips that are defined by intersecting vertical cleave lines y-y' and horizontal cleave lines x-x'. A wafer 40 in accordance with the present invention may include any number of columns (bars) and rows of optical devices. The columns (bars) of a given wafer 40 may be staggered by a given offset such as that which is illustrated in FIGS. 5 and 6.

PCT International Application No. PCT/IB2010/000716, which is incorporated herein by reference, sets forth in detail various wafer arrangements. Cleaving of the optical devices from the wafer 40 may also be performed in accordance with PCT International Application No. PCT/IB2010/000716. Specifically, the wafer 40 may be cleaved along the vertical cleave lines and horizontal cleave lines so as to separate the optical devices from the wafer 40. In one embodiment, the optical devices may be cleaved from the wafer along vertical cleave lines y-y' and horizontal cleave lines x-x' such that the wavelength monitor section remains on the optical device after cleaving the optical device 10 from the wafer.

As used herein, the term cleaving includes the separation of one or more optical chips from the wafer along one or more cleave lines. Accordingly, cleaving includes the separation of multiple optical devices from the wafer together (e.g., as a bar). For example, a bar of optical devices may be cleaved from the wafer by cleaving along vertical cleave line y-y'. Testing of the optical devices may also be performed at the bar level. Individual optical chips may subsequently be cleaved from the bar.

Depending on the desired use of the optical device, at least a portion of the wavelength monitor 32 may remain on the optical device after being cleaved from the wafer. The optical device may therefore be tested subsequent to being cleaved from the wafer (e.g., while in bar form, as an individual optical device, during use of the optical device). Testing may be performed at various times. For example, an optical device that is tested while on the wafer or while cleaved from the wafer at the bar level may also be tested in individual form (either prior to use or during use). Of course, the wavelength monitor 32 may be cleaved from the optical device (e.g., along cleave line a-a') at a later time. In embodiments where the wavelength monitor 32 is cleaved from the optical device, the wavelength monitor 32 may be considered a sacrificial wavelength monitor. As such, the sacrificial wavelength monitor 32 may have no further use after being cleaved from the optical device.

In another embodiment, the optical device may be cleaved from the wafer (e.g., along vertical cleave lines a-a') such that all or a portion of the wavelength monitor remains on the wafer. The portion of the wafer that includes the wavelength monitor (e.g., the portion between vertical cleave line y-y' and a-a') may be considered a discardable portion of the wafer 40.

In an alternative embodiment, at least a portion of the wavelength monitor of an optical device while on the wafer may be located on a portion of an adjacent optical device. FIG. 5 shows an exemplary arrangement where the wavelength monitor 32 is of the two photodiode type and is constructed on the optical device adjacent to the optical device to be tested while on the wafer. After the testing procedure, the optical device may be cleaved from the wafer along vertical cleave line a-a' and the wavelength monitor 32 of the given optical device will remain on the adjacent optical device. Of course, in embodiments where the wavelength monitor is coupled to the laser 14 via SOA 28, the SOA 28 may also be constructed on the adjacent optical device, and the SOA 28 may remain on the adjacent optical device after cleaving.

As discussed above, at least a portion of the wavelength monitor 32 may be located at any suitable position on the optical device 10. FIG. 6 illustrates an exemplary embodiment where the wavelength monitor 32 is coupled to the laser 14 proximal the front grating 22. In this example, the wavelength monitor 32 receives light from the front grating of the laser and is amplified by an SOA 28 before measurement. The given optical device 10 may be tested on the wafer and then cleaved. In this arrangement, the wavelength monitor 32 of the given optical device remains on the adjacent optical column (bar) while the SOA 28 remains in place after cleaving. The SOA 28 is functional in the operation of the optical device.

Accordingly, the optical devices that are formed on the wafer in accordance with the present invention may be tested by an associated wavelength monitor that is also formed on the wafer. The features of the present invention allow for the acquisition of optical device parameters at an early stage during device fabrication. Furthermore, depending on the arrangement of the wavelength monitor on the wafer, the wavelength monitor may remain on the optical device subsequent to the optical device being cleaved from the wafer, or the wavelength monitor may remain on at least one of an adjacent optical device or a discardable portion of the wafer subsequent to cleaving.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A wafer including:
   a plurality of optical devices separable by cleaving, each optical device including a light source including a waveguide, and each light source being configured to output light; and
   at least one optical wavelength monitor including a photodiode, the optical wavelength monitor being configured to output a signal that is representative of a wavelength of the light output by the light source of at least one optical device included on the wafer,
   wherein at least a portion of the optical wavelength monitor is arranged on the wafer to remain on at least one of, selected from a group consisting of: an adjacent optical device and a discardable portion of the wafer subsequent to cleaving.

2. The wafer of claim 1, wherein the photodiode includes a semiconductor material having a band-gap wavelength that is shorter than the wavelength of the light output through the waveguide.

3. The wafer of claim 1, wherein the photodiode is configured to absorb a portion of the light output from the light source, the absorption being wavelength dependent.

4. The wafer of claim 1, wherein the wavelength monitor includes an additional photodiode configured to output an additional signal that is representative of the wavelength of the light, wherein the outputs of the photodiodes respond differently to wavelength.

5. The wafer of claim 1, wherein the wavelength monitor includes an additional photodiode configured to output an additional signal that is representative of the total optical power of the light.

6. The wafer of claim 4, wherein the photodiode and the additional photodiode are arranged in series along the waveguide.

7. The wafer of claim 6, wherein the photodiode is arranged within the light source and the additional photodiode is coupled to the light source.

8. The wafer of claim 4, wherein
the integrated wavelength monitor includes a splitter; and
the photodiode and the additional photodiode are arranged in parallel along the waveguide.

9. A method of manufacturing and testing an optical device among a plurality of optical devices on a wafer, the method including:
forming a plurality of optical devices on the wafer, each optical device including a light source including a waveguide, and each light source being configured to output light;
forming at least one optical wavelength monitor including a photodiode, the optical wavelength monitor being configured to output a signal that is representative of a wavelength of the light output by the light source of at least one optical device included on the wafer;
monitoring the light output from the light source at the optical wavelength monitor;
outputting a signal from the optical wavelength monitor that is representative of the wavelength of the light; and then
cleaving the optical devices from the wafer,
wherein at least a portion of the optical wavelength monitor is arranged on the wafer to remain on at least one of, selected from a group consisting of: an adjacent optical device and a discardable portion of the wafer subsequent to cleaving.

10. The method of claim 9, wherein the photodiode is configured to absorb a portion of the light output from the light source, the absorption being wavelength dependent.

11. The method of claim 9, wherein the wavelength monitor includes an additional photodiode configured to output an additional signal that is representative of the wavelength of the light, wherein the outputs of the photodiodes respond differently to wavelength.

12. The method of claim 9, wherein the wavelength monitor includes an additional photodiode configured to output an additional signal that is representative of the total optical power of the light.

13. The method of claim 9, wherein monitoring is performed over a range of wavelengths.

* * * * *